(12) United States Patent
Huang

(10) Patent No.: US 7,233,276 B1
(45) Date of Patent: Jun. 19, 2007

(54) PIPELINED ANALOG TO DIGITAL CONVERTER WITH CAPACITOR MISMATCH COMPENSATION

(75) Inventor: Chih-haur Huang, Tainan (TW)

(73) Assignee: Himax Technologies, Inc. (TW)

( * ) Notice: Subject to any disclaimer, the term of this patent is extended or adjusted under 35 U.S.C. 154(b) by 0 days.

(21) Appl. No.: 11/289,045

(22) Filed: Nov. 29, 2005

(51) Int. Cl.
*H03M 1/34* (2006.01)

(52) U.S. Cl. ........................ 341/163; 341/118
(58) Field of Classification Search ............... 341/155, 341/161, 172, 163, 118
See application file for complete search history.

(56) References Cited

U.S. PATENT DOCUMENTS

| | | | |
|---|---|---|---|
| 4,760,376 A * | 7/1988 | Kobayashi et al. | 341/155 |
| 5,416,485 A * | 5/1995 | Lee | 341/172 |
| 6,320,530 B1 * | 11/2001 | Horie | 341/163 |
| 6,420,991 B1 | 7/2002 | Yu | 341/161 |
| 7,030,801 B2 * | 4/2006 | Luo | 341/155 |

* cited by examiner

*Primary Examiner*—Peguy JeanPierre
(74) *Attorney, Agent, or Firm*—Baker & McKenzie LLP

(57) ABSTRACT

In a pipelined analog to digital converter with multiple stages of sub-converters, capacitor mismatch error can be reduced by splitting the capacitors into multiple numbers and randomly selecting part of the split capacitors as feedback capacitors. The selection of feedback capacitors can be made according to a digital output, clock phase, stage number of the sub-converter or the combination thereof. The approach of the present invention can be applied to the most significant bit (MSB) stage for a pipelined ADC. Moreover, a method for implementing the same is also proposed.

2 Claims, 3 Drawing Sheets

| Phase | Digital output | $C_{11}$ | $C_{12}$ | $C_{21}$ | $C_{22}$ |
|---|---|---|---|---|---|
| Phase 1 | 00 | FB | FB | $-V_{ref}$ | $-V_{ref}$ |
| | 01 | GND | GND | FB | FB |
| | 10 | FB | FB | $V_{ref}$ | $V_{ref}$ |
| Phase 2 | 00 | $-V_{ref}$ | FB | FB | $-V_{ref}$ |
| | 01 | FB | GND | GND | FB |
| | 10 | $V_{ref}$ | FB | FB | $V_{ref}$ |
| Phase 3 | 00 | $-V_{ref}$ | $-V_{ref}$ | FB | FB |
| | 01 | GND | FB | FB | GND |
| | 10 | $V_{ref}$ | $V_{ref}$ | FB | FB |
| Phase 4 | 00 | FB | $-V_{ref}$ | $-V_{ref}$ | FB |
| | 01 | GND | FB | FB | GND |
| | 10 | FB | $V_{ref}$ | $V_{ref}$ | FB |

PIPELINED ANALOG TO DIGITAL CONVERTER WITH CAPACITOR MISMATCH COMPENSATION

BACKGROUND OF THE INVENTION

1. Field of the Invention

The present invention relates to a pipelined analog to digital converter, especially to a pipelined analog to digital converter with a capacitor augmented and randomly selected as a feedback capacitor to compensate capacitance mismatch.

2. Related Art of the Invention

Analog-to-digital conversion processes to convert an analog signal, which is most commonly represented as a voltage, into a digital format. Serial, delta-sigma, parallel, and pipelined methods are well known analog-to-digital conversion architectures. Different architectures are suited to different needs.

A serial analog-to-digital architecture offers a wide range of performance in analog-to-digital conversion, from low power and low resolution to quantizations with very high resolutions. A serial architecture typically quantizes analog data at the rate of one bit per cycle. Therefore, a digital sample having N bits of resolution will take N cycles to complete quantization.

A delta-sigma analog-to-digital architecture is often used in audio signal processing. The architecture is designed to translate high-speed, low-resolution samples into higher-resolution, lower-speed outputs. This process is also referred to as oversampling because more samples of the analog data are quantized than actually outputted.

By contrast, a parallel analog-to-digital architecture provides the fastest quantization rate per analog signal. In a parallel (or "flash") architecture, a digital value per cycle is produced for each analog data sample, without regard to N, the number of bits of resolution. A parallel architecture requires that all quantization levels be simultaneously compared to the analog signal. This results in the use of $2^{N-1}$ comparators and $2^{N+1}$ resistors to achieve a digital value, with N bits of resolution, per cycle. For higher resolution, the circuit complexity of the flash analog-to-digital converter ("ADC") will greatly increase.

Two-step flash architectures arose to address the circuit complexity issue of flash ADCs, where the two-step flash ADCs first performs a coarse quantization, the held signal is then subtracted from an analog version of the coarse quantization, and the residue is then more finely quantized. This significantly reduces the number of comparators required in a standard flash ADC architecture, but additional clock cycles are required to process the signal due to the extra stage. Another enhancement arose, where interstage gain was used to tolerate larger comparator offset for second stage comparators, which ultimately led to the pipelined ADC architecture employing multiple stages. The sampled input at each stage of a pipelined ADC architecture is converted to a particular resolution of the stage, such as n bits per stage.

Pipelined analog-to-digital architecture, like serial analog-to-digital architecture, is a method of quantizing an analog signal in stages. Algorithms exist for obtaining either 1 or 1.5 bits of resolution per stage. In a 1.5-bit per stage converter, the digital output Di of each stage is either 1, 0, or −1. In a 1-bit per stage converter, the digital output of each stage is either 1 or −1 (or 1 or 0). For either algorithm, N stages are used for an N-bit digital value. One bit is resolved at each stage with the result and a residual analog signal sample passed along to the next stage for resolution of another bit.

In a 1.5-bit per stage converter, the other ½ bit in each stage is redundant. Digital correction logic eliminates the redundancy to produce an N-bit result. Producing a single digital value for a single analog input requires N cycles, one for each stage. However, the pipelining permits a high degree of parallelism, so that one output per cycle can be produced after the pipeline fills up.

In prior art ADC circuits such as a 1.5-bit ADC, charge transfer occurs from one input capacitor to a second capacitor in the feedback loop of an amplifier via the virtual ground node of the amplifier. In this manner, the input capacitor discharges to the feedback capacitor, giving rise to an output voltage that is proportional to the capacitor ratio (i.e., input capacitance/feedback capacitance). For example, a gain of "2" may be created by providing an input capacitor having a capacitance value twice that of the feedback capacitor.

FIG. 1 shows a schematic diagram of a conventional pipelined 1.5-bit ADC 10, where the ADC 10 has, for example, a 12-bit output (N=12). The ADC 10 comprises a plurality of 1.5-bit sub converter stages 101–110 and a final flash stage 112. The input analog voltage signal is resolved into a 1.5-bit digital code in a coarse analog-to-digital sub-converter (ADSC) within the first stage 101. With a 1.5-bit ADC, only three codes are possible, such as 00, 01, and 10. The resulting 1.5-bit code is outputted to a digital error correction (DEC) circuit 120. The code is also converted, via a digital-to-analog sub-converter (DASC) within the first stage 101, back into a coarse analog signal with one of three predetermined analog values, such as −Vref, 0, +Vref. The result is subtracted from the sampled-and-held analog input signal Vin via a subtractor within the first stage 101. The resulting analog "residue" is gained up by a factor of two using a multiplier to become the input voltage for the successive conversion, which is sent to the next stage 102. The output sub-words from the 1.5-bit stages 101–110 are processed by the DEC circuit 120 for correcting the associated comparator and amplifier offset due to the coarse treatment in each 1.5-bit stage. The corrected result is then concatenated with the output of the final flash stage 112 to obtain a 12-bit digital counterpart of the input signal;

FIG. 2A shows a circuit diagram to fulfill one 1.5-bit stage in a sampling phase, the 1.5-bit stage such as the stage 101 shown in FIG. 1 comprises an amplifier 140, two capacitors C1 and C2 connected in parallel between an input node 142 and an inverting input of the amplifier 140, a non-inverting input of the amplifier 140 is connected to ground. The input analog voltage Vin is further fed to two comparators 152 and 154 to compare with two reference voltages, respectively. The comparison results of the two comparators 152 and 154 are sent to a digital output unit 150 for generating a digital output Di for this stage. The two reference voltages are, for example, +Vref/4 and −Vref/4 and used to quantize the input voltage into the digital output Di (1, 0, or −1) of each stage, as shown in FIG. 3. During the sampling phase, the input voltage Vin is established across the capacitors C1 and C2.

FIG. 2B shows a circuit diagram to fulfill one 1.5-bit stage in a hold (amplifying) phase. In this phase, switches (not shown) are used to connect one node of the capacitor C1, which is originally connected to the input node, to the output node of the amplifier 140. The switches further connect one node of the capacitor C2, which is originally connected to the input node, to Di·Vref, which is the product of the digital output Di and the reference voltage Vref. Therefore, residual voltage can be generated at output node of the amplifier 140 in the amplifying phase.

In the above-mentioned pipelined ADC, the mismatch of capacitor will cause significant error. Therefore, various approaches are proposed to compensate the capacitor mismatch or minimize the effect of capacitor mismatch.

U.S. Pat. No. 6,420,991 discloses a dynamic element matching for converting element mismatch into white noise for a pipelined ADC. In a sample period, as shown in FIG. 5 of that patent, all capacitors are connected in parallel between the input node and the inverting input of an amplifier, which is virtually grounded through the non-inverting input of the amplifier. In a hold (amplifying) period, the connection of the input connection capacitors are fixed once the digital codes from the sub-converter are determined. In addition, the feedback capacitor is usually predetermined to be C11 for all times. The other capacitors C21–C2$p$ are randomly connected to Vref, GND and –Vref with a pseudo-random code generated by a digital circuit. However, this patent does not disclose any way to randomly use capacitors and much improvement is desired.

SUMMARY OF THE INVENTION

The present invention provides a pipelined analog to digital converter with minimal capacitor mismatch error and a method for the same.

Accordingly, the present invention splits the capacitors into multiple numbers for at least one sub converter in a pipelined ADC. Moreover, parts of the split capacitors are randomly connected as feedback capacitors during a hold phase.

In one aspect of the present invention, the number of the capacitors in one sub-converter is doubled to increase the randomness of feedback capacitors during a hold phase.

In another aspect of the present invention, the feedback capacitors are selected according to a digital output of the sub converter, clock phase, stage number or a combination thereof.

In still another aspect of the present invention, the capacitor splitting and the feedback capacitor selection can be applied to the MSB stage of the pipelined ADC to compensate significant capacitor mismatch error without excessive circuit complexity.

DETAILED DESCRIPTION OF THE INVENTION

According to one aspect of the present invention, the present invention proposes a capacitor splitting approach to augment the capacitors with multiple numbers to, for example, double the capacitor numbers to address the problem of capacitor mismatch.

Figure 2A:
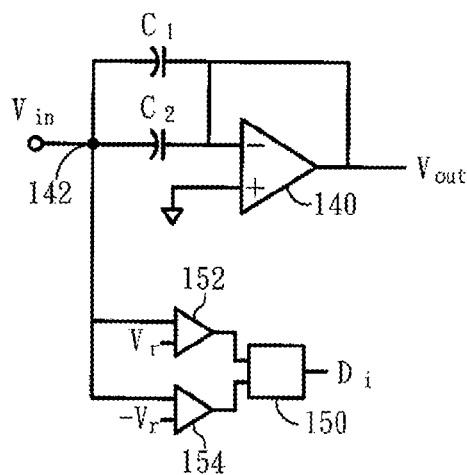
FIG. 2A shows a circuit diagram of a conventional 1.5-bit sub-converter in a sampling phase.
Figure 2B:
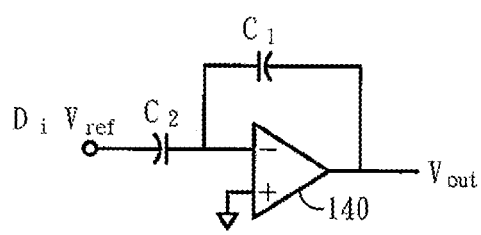
FIG. 2B shows a circuit diagram of a conventional 1.5-bit sub-converter in a hold phase.
Figure 3:
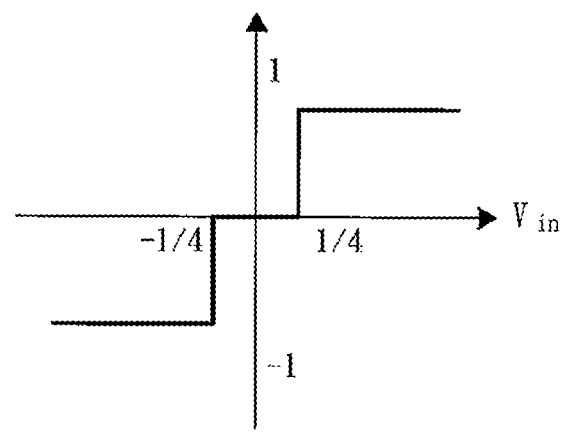
FIG. 3 shows the quantization of input voltage in a conventional 1.5-bit sub-converter.
Figure 4A:
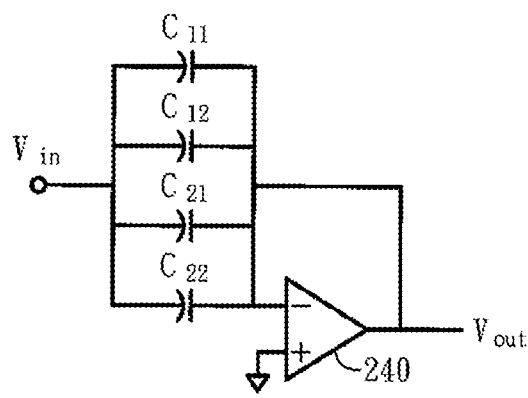
FIG. 4A shows a schematic diagram of a sub-converter in a 1.5-bit/stage pipelined ADC in a sampling phase according to a preferred embodiment of the present invention.
Figure 4B:
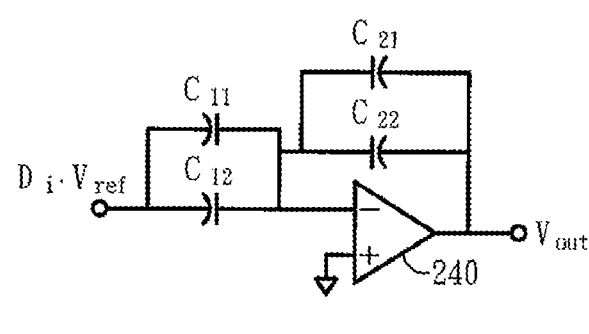
FIG. 4B shows a schematic diagram of a sub-converter in a 1.5-bit/stage pipelined ADC in a hold phase according to a preferred embodiment of the present invention.

FIGS. 4A and 4B show schematic diagrams of a sub-converter in a 1.5-bit/stage pipelined ADC in a sampling phase and hold phase, respectively, according to a preferred embodiment of the present invention. With reference also to FIGS. 2A and 2B, in the sub-converter of the conventional 1.5-bit/stage pipelined ADC, there are two capacitors per stage. More particularly, the capacitor C1 is used as a feedback (FB) capacitor in a hold phase, and the capacitor C2 is used as an input connection capacitor in both the sampling and hold phases. According to a preferred embodiment of the present invention, at least one sub-converter stage in the pipelined ADC comprises capacitors with augmented numbers. The capacitors are augmented by splitting the capacitors into multiple numbers.

According to the capacitor splitting approach of the present invention, the capacitors C1 and C2 are split to capacitors C11, C12, C21 and C22, as shown in FIG. 4A. Moreover, in successive hold phases, the split capacitors C11, C12, C21 and C22 are selected as FB capacitors randomly. The splitting of capacitors into more numbers increases the random degree for the selection of FB capacitors. Therefore, the capacitor mismatch can be advantageously compensated. The selection of the FB capacitors can be made by a switch unit based on information such as the clock phase, digital output of the sub converter stage and stage number. The selection criterion and the arrangement of the switch unit are discussed in detail below.

Figures 5, 6:
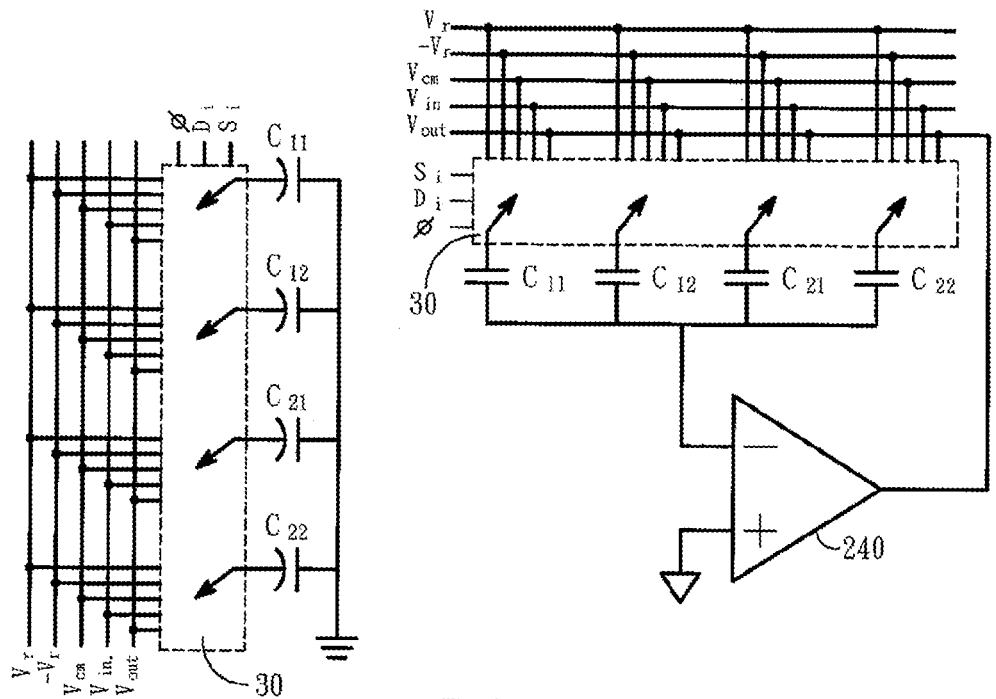
FIG. 5 shows a schematic diagram of a sub-converter in a 1.5-bit/stage pipelined ADC with a switch unit according to a preferred embodiment of the present invention.
FIG. 6 shows an exemplary connection selection operated by the switch unit according to a preferred embodiment of the present invention.

FIG. 5 shows a schematic diagram of a sub-converter in a 1.5-bit/stage pipelined ADC according to a preferred embodiment of the present invention. A switch unit 30 is incorporated to select a part of the split capacitors C11, C12, C21 and C22 to be the FB capacitors in a hold phase. As shown in this figure, the switch unit 30 is indicated by a dashed box and placed between the split capacitors C11, C12, C21 and C22 and the associated nodes in the sub-converter. The associated nodes includes an input node (Vin), an output node (Vout), a ground node (Vcm), a positive reference voltage node (Vr) and a negative reference voltage node (–Vr). In a sampling phase, the split capacitors C11, C12, C21 and C22 are connected in parallel between Vin node and an inverting input of the amplifier 240 by the switching of the switch unit 30. The inverting input of the amplifier 240 is a virtual ground because the non-inverting input of the amplifier 240 is grounded. In a hold phase, part of the split capacitors C11, C12, C21 and C22 functions as the FB capacitors by the switching of the switch unit 30. The remaining capacitors function as input connection capacitors by the switching of the switch unit 30.

The selection criterion of the FB capacitor of the switch unit 30 can be made according to the digital output of the sub converter in each stage. For example, a 1-bit/stage sub-converter generates the digital output of 1 or 0. Two possible selections can be made according the digital output of the sub-converter. For a 2-bit/stage pipelined ADC, the sub-converter will generate the digital output of 00, 01, 10, or 11. Four possible selections can be made according the digital output of the sub-converter.

The selection criterion of FB capacitor of the switch unit 30 can be made according to other information such as clock phase and stage number, or any combination thereof. This will be exemplified by the preferred embodiment shown in FIG. 6.

FIG. 6 shows an exemplary connection selection operated by the switch unit 30 based on the digital output 00, 01, and 10 of the sub-converter and the clock phases 1–4. The switch unit 30 controls the connection paths of the split capacitors C11, C12, C21 and C22 in a 1.5-bit/stage sub-converter. In this figure, FB indicates feedback connection path, Vref indicates the connection path to the positive reference voltage, GND indicates the connection path to ground and −Vref indicates the connection path to the negative reference voltage. As can be seen from this figure, the splitting of capacitors and the selection criterion of FB capacitors according to the present invention can randomize the FB connection path and minimize the capacitor mismatch error.

Figure 1:
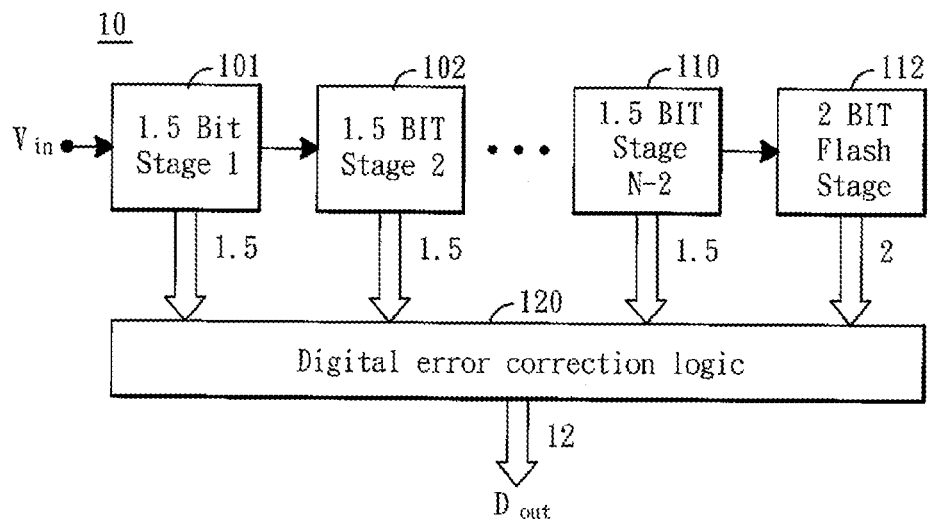
FIG. 1 shows a schematic diagram of a conventional pipelined 1.5-bit ADC.

In the present invention, the splitting of capacitors and the selection criterion of FB capacitors can be used for pipelined ADC of various kinds, such as 1-bit/stage ADC, 1.5-bit/stage ADC, 2-bit/stage ADC, etc. Moreover, the splitting of capacitors and the selection criterion of FB capacitors can be applied to a selective stage of the pipelined ADC instead of all stages. For example, the approach of the present invention can be applied to the most significant bit (MSB) stage for a conventional pipelined ADC such as the first stage 101 shown in FIG. 1.

Although several embodiments are specifically illustrated and described herein, it will be appreciated that modifications and variations of the present invention are covered by the above teachings and within the purview of the appended claims without departing from the spirit and intended scope of the present invention.

What is claimed is:

1. In a pipelined analog-to-digital converter (ADC) comprising multiple stages of at least one sub-converter, each sub-converter comprising an amplifier and at least one capacitor, a method for minimizing capacitor mismatch comprising the steps of:

augmenting at least one capacitor with at least one additional capacitor for at least one stage of one sub-converter; and randomly connecting one of the augmented capacitor and the additional capacitor as a feedback capacitor in a hold phase, wherein the feedback capacitor is connected based on a stage number of the sub-converter.

2. A pipelined analog-to-digital converter (ADC) comprising:

a plurality stages of at least one sub-converter, each sub-converter comprising an amplifier, and at least one capacitor, and at least one sub-converter comprising a capacitor augmented with at least one additional capacitor and at least one of the augmented capacitor and the additional capacitor being randomly connected as a feedback capacitor in a hold phase, wherein the feedback capacitor is connected based on a stage number of the sub-converter.

* * * * *